United States Patent [19]

Gill, Jr.

[11] Patent Number: 5,624,501
[45] Date of Patent: Apr. 29, 1997

[54] APPARATUS FOR CLEANING SEMICONDUCTOR WAFERS

[76] Inventor: Gerald L. Gill, Jr., 1812 Peaceful Mesa, Prescott, Ariz. 86301

[21] Appl. No.: 534,053

[22] Filed: Sep. 26, 1995

[51] Int. Cl.$^6$ ..................................................... B08B 7/00
[52] U.S. Cl. ............................... 134/6; 134/32; 134/33; 134/902; 15/88.2; 15/97.1
[58] Field of Search ................................ 15/77, 88.1, 88.2, 15/97.1, 102, 230, 230.16, 230.18; 134/902, 2, 32, 33, 6; 451/41

[56] References Cited

U.S. PATENT DOCUMENTS

| | | | |
|---|---|---|---|
| 3,970,471 | 7/1976 | Bankes et al. | 134/33 |
| 4,344,260 | 8/1982 | Ogiwara | 451/44 |
| 4,662,124 | 5/1987 | Kato et al. | 451/41 |
| 4,811,443 | 3/1989 | Nishizawa | 15/97.1 |
| 5,311,634 | 5/1994 | Andros | 15/102 |
| 5,351,360 | 10/1994 | Suzuki et al. | 134/902 |
| 5,375,291 | 12/1994 | Tateyama et al. | 134/902 |

*Primary Examiner*—Jill Warden
*Assistant Examiner*—Alexander Markoff
*Attorney, Agent, or Firm*—Tod R. Nissle, P.C.

[57] ABSTRACT

Opposed, conically shaped brushes are utilized to mechanically and chemically removed foreign material from the surfaces of a semiconductor wafer. The brushes are be readily accessed for cleaning and contact a relatively large surface area of the wafer.

19 Claims, 5 Drawing Sheets

APPARATUS FOR CLEANING SEMICONDUCTOR WAFERS

This invention relates to apparatus for processing semiconductor wafers and other objects.

More particularly, the invention relates to apparatus for cleaning apparatus by mechanically and chemically removing foreign material from the surfaces of wafers consisting of semiconductor material or other material.

When a semiconductor wafer is abraded or ground, portions of the material comprising the wafer are removed. Similarly, when a semiconductor wafer is polished or planarized, portions of the wafer material are removed. Polishing often comprises a chemical and mechanical process during which a soft outer layer is chemically formed on the semiconductor wafer. The soft layer is then mechanically removed. Such a polishing process minimizes damage to the wafer material. In contrast to abrading, grinding, polishing, and planarizing, cleaning ordinarily removes little, if any, original wafer material. The purpose of cleaning a semiconductor wafer is to mechanically scrub a wafer surface to remove foreign material on the surface. When the wafer is cleaned after polishing or planarization, such foreign material can, for example, consist of alumina slurry particles or of trace impurities in the chemicals used in the slurry used to polish the semiconductor wafer. The trace impurities may electrically bond or otherwise adhere to the polished surface of the wafer material. The semiconductor wafer may also be cleaned after polishing and grinding steps.

The use of brushes, sponges, or pads to clean semiconductor wafers is well known in the art. Such cleaning aides can consist of polyvinyl alcohol (PVA) sponges, of brushes with nylon bristles, of mohair, or of soft polishing pads such as the POLITEX SUPREME PAD manufactured by Rodel, Inc. In one prior art cleaning apparatus a flat thin circular semiconductor wafer is interposed between a pair of flat "pancake" brushes. Each brush includes a flat planar circular surface. The surface can be smooth or can include a plurality of upstanding elastic feet which rotate over and clean one or both sides of the semiconductor wafer. A disadvantage of the pancake brushes is that it is difficult to access the cleaning surfaces in order to add fluids, surfactants, and other cleaning aides and to flush away or otherwise remove debris or particles during the cleaning operation.

In another prior art apparatus the curved radial outer surface of one cylindrical brush or of each of a pair of opposing cylindrical brushes is rotated over a semiconductor wafer to clean the wafer. A disadvantage of the cylindrical brush is that in order to contact the surface being cleaned over a large area the brush must have a relatively large diameter. Another disadvantage of some prior art apparatus is that it does not readily adapt to cleaning semiconductor wafers of differing diameter.

Accordingly, it would be highly desirable to provide an improved cleaning apparatus for wafers and other objects which was readily cleaned, which could provide a brush surface which had a curvature comparable to that of a very large diameter cylindrical brush but which occupied a smaller area, and which could be utilized to clean the surfaces of flat wafers of differing diameter or width.

Therefore, it is a principal object of the invention to provide improved apparatus for cleaning thin wafers or other objects.

A further object of the invention is to provide improved wafer cleaning apparatus which is readily cleaned while being used to mechanically scrub or otherwise remove foreign material from a wafer, and which therefore tends not readily to accumulate particles of slurry particles from, for example, the surface of a disk or wafer being cleaned following a chemical-mechanical polishing process or to accumulate foreign particles removed from the wafer.

Another object of the invention is to provide improved wafer processing apparatus which can clean circular or non-circular large semiconductor disks or panels, small disks or panels, or perforated disks or panels.

BRIEF DESCRIPTION OF THE DRAWINGS

These and other, further and more specific objects and advantages of the invention will be apparent to those skilled in the art taken in conjunction with the drawings, in which.

Briefly, in accordance with my invention, I provide improved apparatus for cleaning work surfaces of a wafer. The apparatus comprises a first cleaning assembly including a first conical cleaning surface; a second cleaning assembly including a second conical cleaning surface opposed to the first conical surface, the first and second conical surfaces being canted with respect to one another such that a contact portion of the first conical surface is substantially parallel to a contact portion of the second conical surface; an assembly for supporting the wafer such that the work surfaces are each intermediate and contact one of the parallel contact portions of the first and second conical surfaces; and, a motive power assembly for moving at least one of the surfaces in the group consisting of the work surfaces of the wafer, the first conical surface, and the second conical surface. The motive power assembly causes relative movement between the wafer and at least one of the first and second conical surfaces.

In another embodiment of the invention, I provide an improved method of cleaning the opposed work surfaces of a wafer. The method includes the step of providing cleaning apparatus including a first cleaning assembly including a first conical cleaning surface; and, a second cleaning assembly including a second conical cleaning surface opposed to the first conical surface, the first and second conical surfaces being canted with respect to one another such that a contact portion of the first conical surface is substantially parallel to a contact portion of the second conical surface. The wafer is positioned intermediate the first and second conical surfaces such that each work surface contacts one of the contact surfaces. At least one of the surfaces in the group consisting of the work surfaces of the wafer, the first conical surface, and the second conical surface is moved. Moving one of said surfaces causes relative movement between the wafer and at least one of the first and second conical surfaces.

In a further embodiment of the invention, I provide improved apparatus for cleaning a work surface of an object. The apparatus includes a cleaning assembly including a first conical cleaning surface defining a radially extending flat conical plane extending from an axis of rotation; an assembly for supporting the object such that the work surface contacts said conical cleaning surface; and, an assembly for turning the cleaning surface about the axis of rotation to move over and clean the work surface of the wafer.

Figure 1:
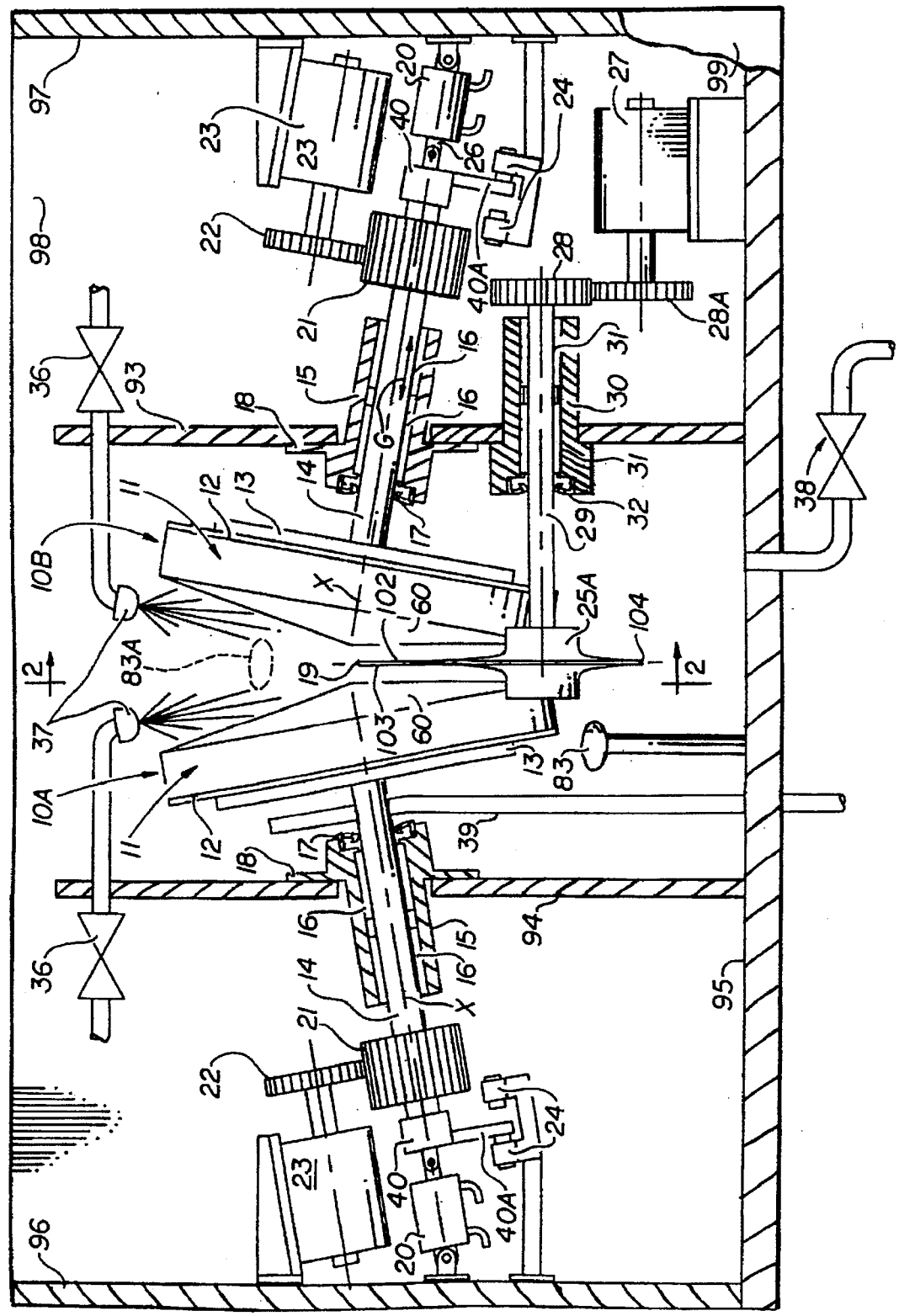
FIG. 1 is a front elevation view illustrating cleaning apparatus constructed in accordance with the principles of the invention.
Figure 2:
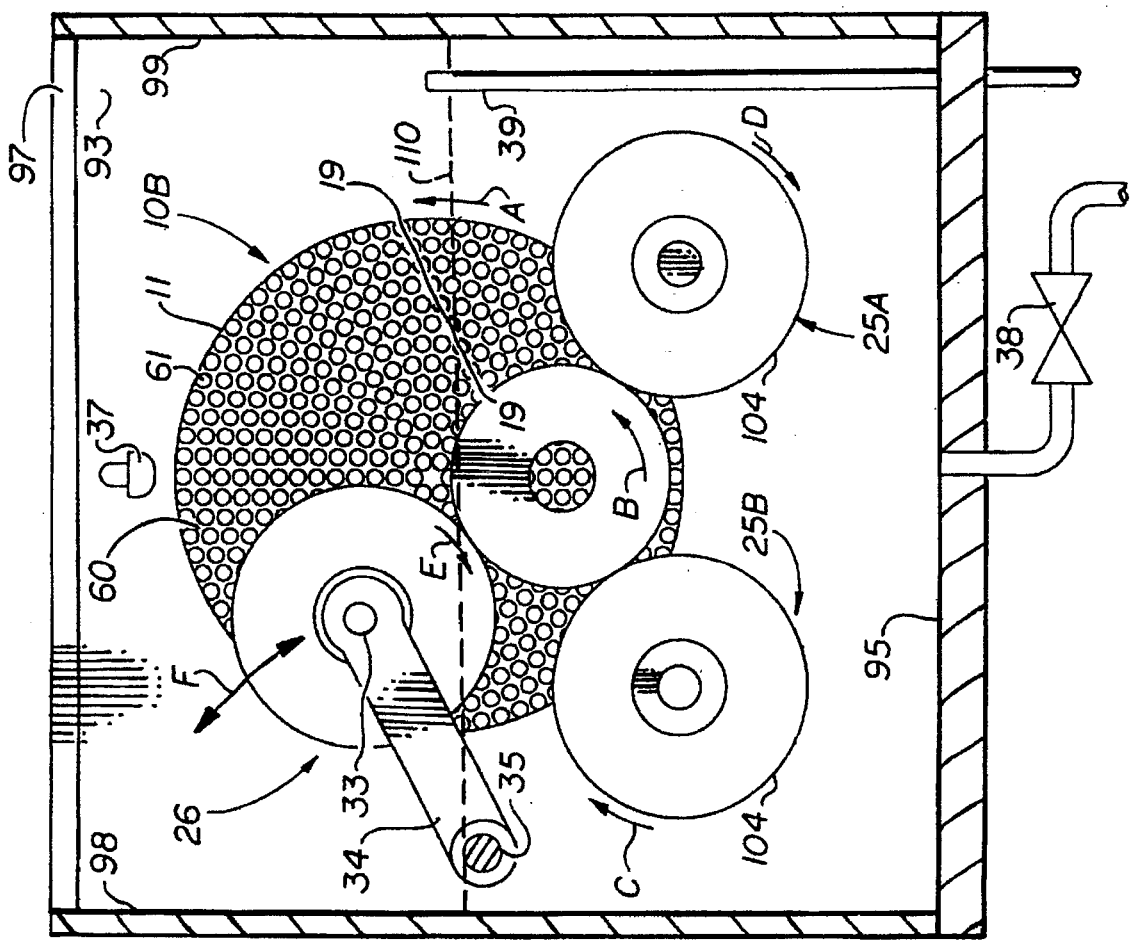
FIG. 2 is a side elevation view illustrating the cleaning of apparatus of FIG. 1 and showing additional construction details thereof.

Turning now to the drawings, which depict the presently preferred embodiments of the invention for the purpose of illustrating the practice thereof and not by way of limitation of the scope of the invention, and in which like reference characters refer to corresponding elements throughout the several views, FIGS. 1 and 2 illustrate cleaning apparatus housed in an open-topped container including bottom or base 95, back wall 98, front wall 99 and side walls 96 and 97. A pair of opposing structurally identical cleaning assemblies 10A and 10B are mounted in the container. Each cleaning assembly 10A, 10B includes a cleaning pad 11 having a conical surface 60 lying in a radially extending flat conical plane which radially extends from an axis of rotation X. Pad 11 can be made out of any desirable material but presently is typically fabricated from an elastic foam material like urethane. The texture of surface 60 can be configured as desired and may be relatively smooth and flat or may be provided with nubs or nipples 61 which depend and outwardly extend from surface 60. Pad 11 is mounted on support plate 12. Support plate 12 is mounted on spindle plate 13 fixedly secured to shaft 14. Shaft 14 extends through cylindrical seal 17, cylindrical bearings 16, and cylindrical bearing housing 15. Flange 18 of housing 15 is connected to wall 93 which upwardly depends from base 95. Wall 94 is parallel and of equivalent size to wall 93. Wall 94 also upwardly depends from base 95. In FIG. 1, the shafts 14 attached to each cleaning assembly 10A and 10B lie in a common plane parallel to the sheet of paper of the drawings and normal to walls 96, 97 and base 95 and parallel to walls 98 and 99. The plate 12 and 13 of each cleaning assembly are presently perpendicular to the axis of rotation X. The axis of rotation X coincides with the centerline of cylindrical shaft 14. When one of pads 11 is pressed against wafer 19 and rotates, it contacts one side or work surface of circular wafer 19 along a line or along an area which in FIG. 1 is parallel to the walls 96 and 97. When the other of pads 11 is pressed against wafer 19 and rotates, it contacts the other side or work surface of circular wafer 19 along a line or along an area which in FIG. 1 is parallel to the walls 96 and 97. Consequently, in FIG. 1, pads 11 are canted with respect to one another such that the portions of the conical surfaces of pads 11 which contact wafer 19 are parallel to one another.

Spindle assembly 40 is fixedly secured to shaft 14 and includes arm 40A which extends between stops 24. Stops 24 limit the travel of shaft 14 and the cleaning assembly 10A in the directions indicated by arrows G in FIG. 1. Linkage 26 connects shaft 14 with actuator 20. Actuator 20 moves shaft 14 in the directions indicated by arrows G. Actuator 20 can position arm 40A at any desired position intermediate stops 24 to control the position of each pad 11.

Gear 21 is fixedly secured to shaft 14. Gear 22 is fixedly secured to a rotatable shaft depending from variable direction motor 23. Motor 23 rotates gear 22 to turn gear 21 and, accordingly, pad 11.

Wafer 19 is maintained in position between pads 11 by support disks 25A, 25B, and 27. The outer peripheral edge 104 of each disk 25A and 25B is provided with a groove. The peripheral edge of wafer 19 seats in this groove. The follower disk 26 can, if desired, also be provided with a groove in which the outer edge of wafer 19 seats. Each disk 25A, 25A is fixedly secured to a shaft 29 which extends through cylindrical seal 32, bearings 31, and bearing housing 30. Housing 30 is attached to wall 93. Gear 28 is fixedly secured to the distal end of shaft 29. Gear 28A is fixedly secured to a rotatable shaft depending from variable speed motor 27. Motor turns gear 28A, which turns gear 28 and the disk 25A, 25B attached to shaft 29. If desired, disks 25A, 25B need not be driven and can be allowed to free wheel. Disengaging gear 28A from gear 28 permits shaft 29 to free-wheel on cylindrical bearings 30. Disk 26 presently free wheels about axle 33. One end of arm 34 is attached to axle 33. The other end of arms 34 is pivotally attached to a shaft or pin 35 such that disk 26 can pivot about shaft 35 in the directions indicated by arrows F. Arm 34 can be manually upwardly pivoted to permit wafer 19 to be removed from between brushes 11 when brushes 11 are spaced apart and in the position illustrated in FIG. 1. Shaft 35 can extend through a seal 32—bearing 31—housing 30 assembly similar to that which receives shaft 29. Such a seal-bearing-housing assembly would permit shaft 35 to freely rotate therein. Similarly, the distal end of shaft 35 can be provided with a gear like gear 28 on shaft 29 so that shaft 35 and disk 26 can be turned by a gear 28A—motor 27 unit so that disk 26 can be brought to bear against the peripheral edge of wafer 19 with a controlled selected pressure.

The grooves in the peripheral edges 104 of disks 25A can be shaped and dimensioned to facilitate seating and/or rotation of square or other non-circular wafer shapes or edges.

Valves 36 control the flow of water, detergent or other fluids through nozzles 37. Different types of fluids can be sequentially passed through nozzles 37. The number and arrangement of nozzles can be varied as desired. The fluid from nozzles 37 functions to clean pads 11 and to lubricate the portion of pads 11 contacting wafer 19.

The pads 11 can be pushed together with a wafer in place and rotated in opposite direction while fluid is dispensed by nozzles 37 to remove particulate from pads 11. When pads 11 are displaced against and cleaning a wafer 19, the portions of pads 11 which extends above wafer 19 and are canted away from one another present surfaces which are readily cleaned by water dispensed from nozzles 37.

In FIG. 1, the surfaces of pads 11 which contact opposite side of the wafer 19 are parallel. If desired, a pad 11 having a conical surface with a slope greater or less than that of the pads in FIG. 1 can be utilized to give a greater pad pressure on one side of wafer 19 in order to facilitate rotation of wafer 19. Or, the cant of the pad 11 in FIG. 1 can be adjusted by canting shaft 14 up or down from the position shown.

The cleaning apparatus of the invention is believed to be an improvement over prior art cylindrical cleaning pads because the conical pads utilized in the invention allow a larger pad surface area to contact a wafer for a given cleaning pad pressure against the wafer due to the very large effective radius of the pad surface.

The cleaning apparatus of the invention is believed also to be an improvement over prior art flat cleaning pads because the conical pads utilized in the invention allow readily access to the surface of the conical pads while the pads are mechanically scrubbing or otherwise cleaning a wafer or other object. Further, the conical cleaning pads of the invention can extend across the entire diameter or width of a wafer to distribute the pressure of the pad against the wafer against a larger area and to prevent point contact types of pressure.

The container can be filled with water or other fluid to the height indicated by dashed line 110 in FIG. 2, or to any other desired height. Closing valve 38 on the liquid drain cause the container to fill with water dispensed by nozzles 37. When the water level in the container reaches a selected height, water escapes from the container through an overflow drain pipe 39. When the container is filled with water, an ultrasonic wave emitter 83 or other desired wave or vibratory emitter can be positioned adjacent wafer 19 to facilitate the cleaning of the wafer. As indicated by dashed lines 83A, emitter 83 can be submerged in a position between pads 11, beneath nozzles 37, and directly above wafer 19.

When brushes 11 rotate in the same direction of travel against wafer 19, the frictional contact with wafer 19 ordinarily causes wafer 19 to rotate. Consequently, wafer 19 will usually rotate between brushes or pads 11 without the use of driven disks 25A, 25B.

By way of example, if in FIG. 2 pad 11 rotates in the direction of arrow A, then wafer 19 rotates in the direction of arrow B, disk 25A rotates in the direction of arrow C, disk 25A rotates in the direction of arrow D, and disk 26 rotates in the direction of arrow E.

In use of the apparatus of FIGS. 1 and 2, the actuators 20 are utilized to move the cleaning assemblies to the positions shown in FIG. 1. Disk 26 is pivoted upwardly about shaft 35 to permit a wafer 19 to be inserted between pads 11 such that the wafer is in the position shown in FIGS. 1 and 2 and such that the peripheral edge of the wafer seats in the grooves extending around the periphery 104 of each disk 25A, 25B. Disk 26 is then lowered to the position shown in FIGS. 1 and 2 with the peripheral edge of disk 26 setting on top of wafer 19. Actuators 20 are utilized to displace pads 11 toward disk 19 such that one pad 11 contacts surface 103 of wafer 19 and the other pad 11 contacts surface 102 of wafer 19. Motors 23 are actuated to turn pads 11 over surfaces 102, 103 of wafer 19. Pads 11 can turn in the same or opposite directions. Wafer 19 can be rotated in any desired direction by disks 25A, 25B. Motors 27 are activated to turn disks 25A, 25B. Before, during, and/or after wafer 19 is being cleaning by pads 11, fluid is dispensed from nozzles 37. After wafer 19 is sufficiently cleaned by brushes 11, motors 23 are turned off to stop the rotation of pads 11 about axes X; motors 27 are turned off; actuators 20 are utilized to return pads 11 to the positions shown in FIG. 1; disk 26 is displaced upwardly in the direction of arrow F; and, wafer 19 is removed from between pads 11.

Figure 3:
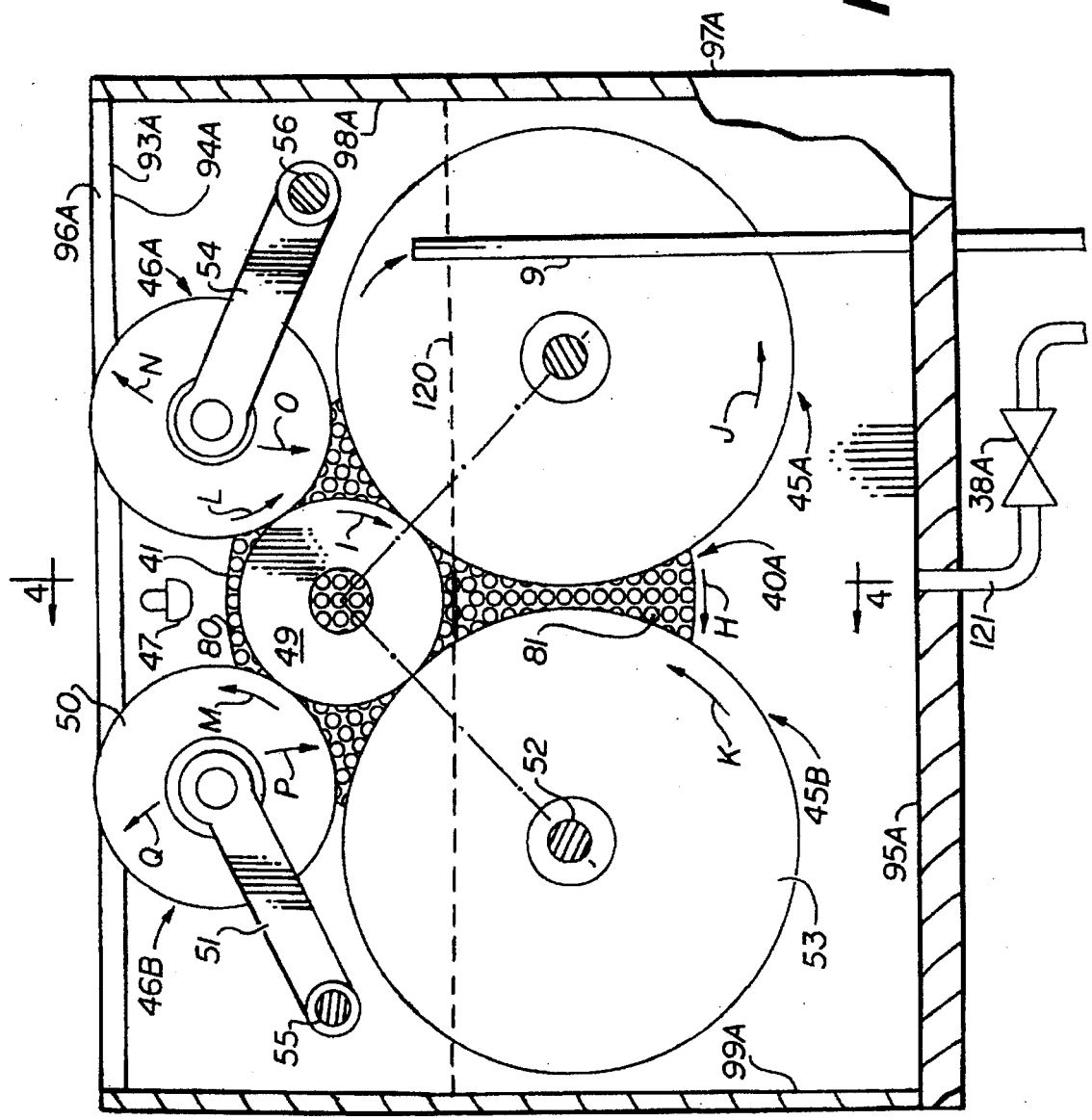
FIG. 3 is a side elevation view illustrating an alternate embodiment of the cleaning apparatus of the invention.
Figure 4:
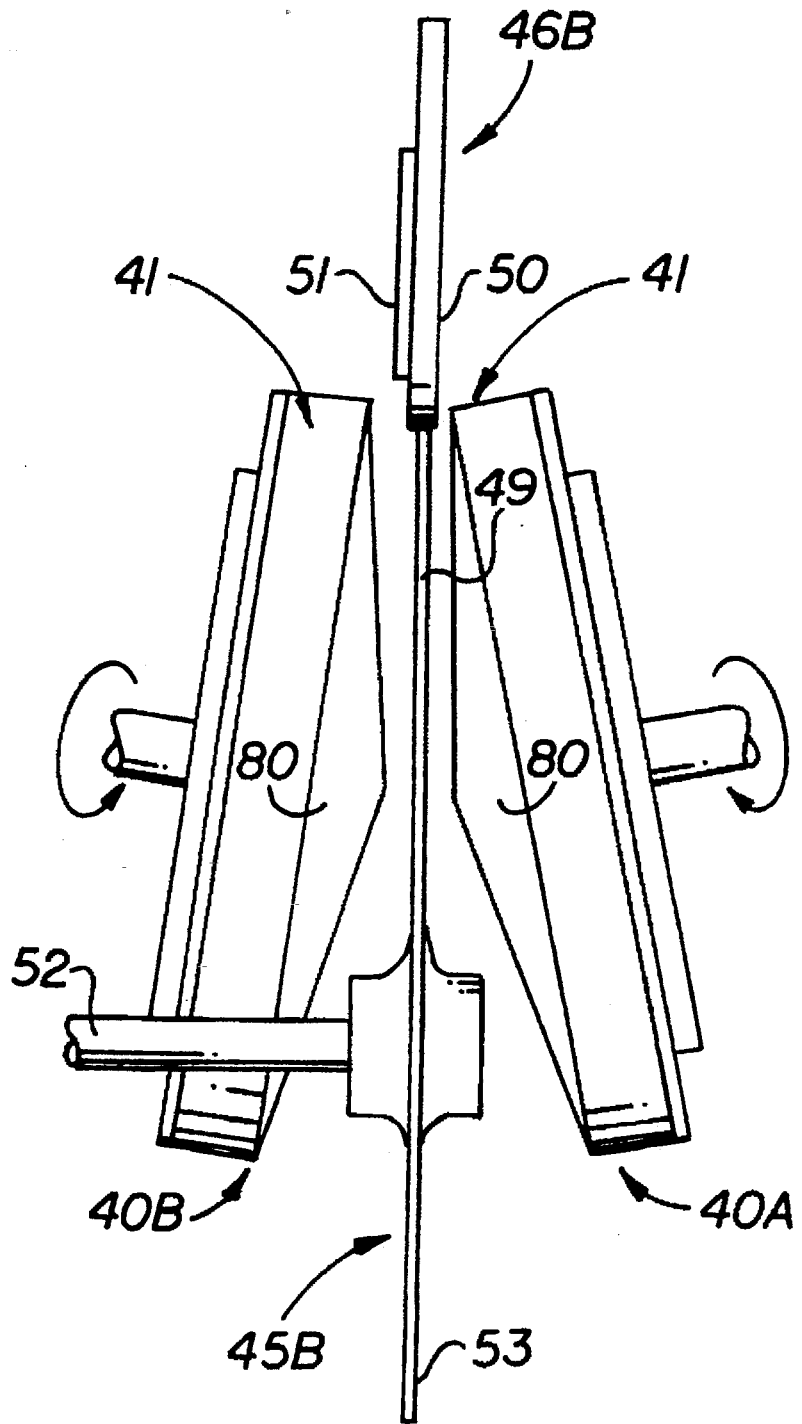
FIG. 4 is a front view further illustrating the cleaning brushes and wafer support assemblies of the apparatus of FIG. 3.

An alternate embodiment of the invention is illustrated in FIGS. 3 and 4 and is similar to the apparatus of FIGS. 1 and 2 except that cleaning assemblies 40A and 40B are canted such that upper portions of cleaning pads 41 are parallel and contacting a wafer 49 instead of the lower portions of the pad shown in FIG. 1. In FIG. 3, a cleaning pad 41 rotating in the direction of arrow H contacts a wafer 49 and causes the wafer to rotate in the direction of arrow I. Disk 45A rotates in the direction of arrow J. Disk 45B rotates in the direction of arrow K. Disk 46B rotates in the direction of arrow M. Disk 46A rotates in the direction of arrow L. Each cleaning pad 41 has a radially extending flat conical surface 80 outwardly extending from the axis of rotation of the cleaning pad 41. Disk 45B includes circular side surface 53. Disk 46B includes circular side surface 50. Overflow drain pipe extends through base 95A to drain off liquid when the liquid level much exceeds the level indicated by dashed line 120 in FIG. 3. When valve 38A is opened, liquid in the container escapes through drain pipe 121 which prevents a reservoir of liquid from accumulating inside the container.

Figure 11:
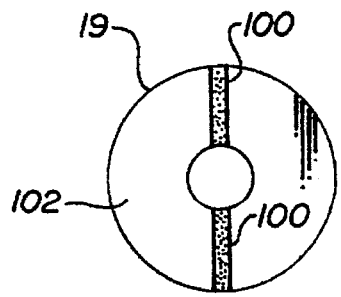
FIG. 11 is an elevation view illustrating the surface area of a wafer contacted by a cleaning brush; and, FIG. 12 is an elevation view illustrating the surface area of a wafer contacted by a cleaning brush.
Figure 12:
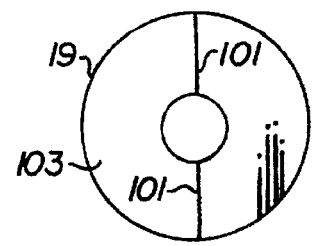

As shown in FIG. 12, when pads 11 or 41 are positioned against a wafer 19, the pads can be only lightly pressed against a surface 103 (or 102) of wafer 19 such that the pad 11 or 41 only contacts surface 103 at points along the lines 101 in FIG. 12. Alternatively, when pads 11 or 41 are positioned against a wafer 19, the pads can pressed against a surface 102 (or 103) of wafer 19 such that the elastic pad compresses and contacts surface 102 at points lying in the planar areas 100 shown in FIG. 11.

Disks 46B and 46A bear against the peripheral edge of wafer 49 to keep wafer 49 seated in grooves which extend around the peripheral edges of disks 45A, 45B. Disk 46B is rotatably mounted on arm 51 which is pivotally attached to shaft 55 so that disk 46B can be displaced in the directions indicated by arrows Q and P. Disk 46A is rotatably mounted on arm 54 which is pivotally attached to shaft 56 so that disks 46A can be displaced in the directions indicated by arrows O and N.

The cleaning assemblies 40A and 40B and associated processing equipment of FIGS. 3 and 4 are mounted in a container including bottom 95A, back wall 98A, front wall 99A, and side walls 96A and 97A.

Figure 5:
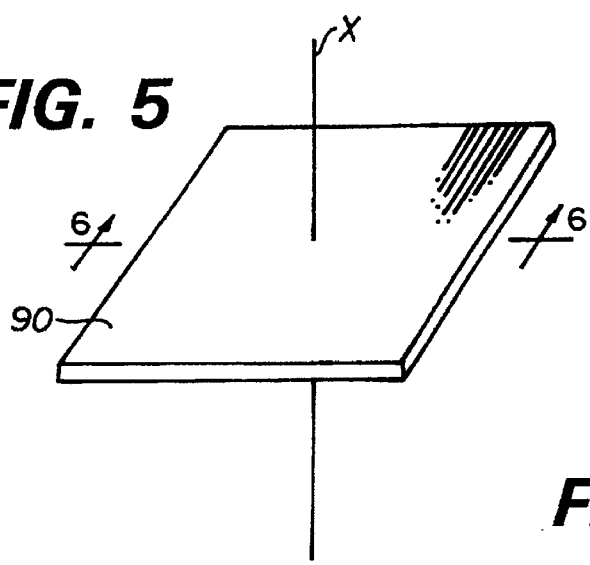
FIG. 5 is a perspective view illustrating a radial flat plane radially extending from an axis of rotation.
Figure 7:
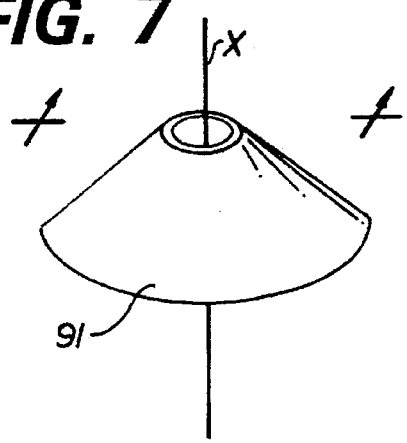
FIG. 7 is a perspective view illustrating a radial conical flat plane radially extending from an axis of rotation.
Figure 6:
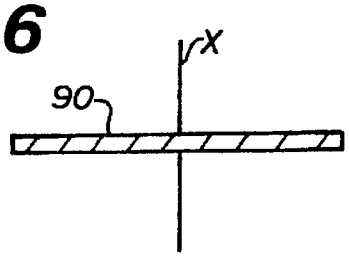
FIG. 6 is a section view illustrating the radial flat plane of FIG. 5 and taken along section line 6—6 thereof.
Figure 8:
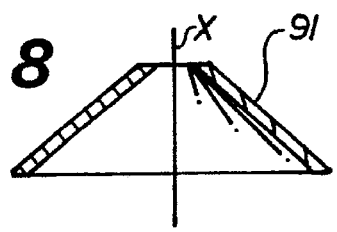
FIG. 8 is a section view illustrating the radial conical flat plane of FIG. 7 and taken along section line 8—8 thereof.

It is presently preferred that a conical pad having a radially extending flat conical surface be utilized in the invention. A radially extending flat conical surface 91 is shown in FIGS. 7 and 8 and comprises a flat conical surface which radially extends from an axis of rotation X. A surface radially extends from axis X if the surface lies along a line or lines which intersect and are at an angle to axis of rotation X. As shown in FIGS. 7 and 8, a flat conical surface need not intersect or completely extend to axis X in order still to be deemed "radially extending". Surface 91 does radially extend from axis 91, as does surface 90 in FIGS. 5 and 6. A radially extending flat conical surface can comprise only a portion of the surface 91.

Surface 90 is a radially extending flat planar surface which radially extends from an axis of rotation X. A radially extending flat planar surface can comprise only a portion of surface 90.

Figure 9:
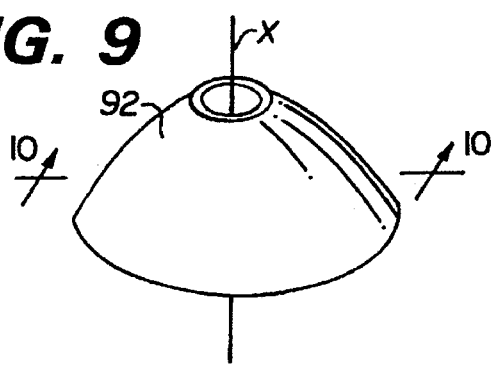
FIG. 9 is a section view illustrating a radial conical arcuate plane radially extending from an axis of rotation.
Figure 10:
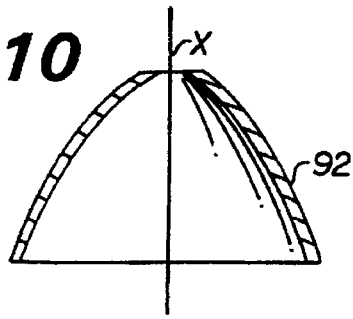
FIG. 10 is a section view illustrating the radial conical arcuate plane of FIG. 9 and taken along section line 10—10 thereof.

Surface 92 in FIGS. 9 and 10 is a radially extending arcuate conical surface which radially extends from an axis of rotation X. A radially extending arcuate conical surface can comprise only a portion of surface 92.

In FIGS. 1 to 4, shafts 14 are horizontally oriented and pads 11 are vertically oriented. As would be appreciated by those of skill in the art, as long as the conical surfaces 60 of opposing pads 11 contact and sandwich wafer 19 along opposing lines on opposite sides of wafer 19, the orientation of shafts 14 and pads 11 can be varied as desired. For example, shaft 14 could each be vertically oriented and pads 11 could, instead of being vertically oriented in the manner illustrated in FIG. 1, be horizontally oriented.

Having described my invention in such terms as to enable those skilled in the art to understand and practice it, I claim:

1. Apparatus for cleaning work surfaces (102, 103) of a wafer, comprising
    (a) a first cleaning assembly including a first conical cleaning surface (10A, 60) extending around a first axis such that a line perpendicular to said first axis passes through a pair of separate points on said first conical cleaning surface which are each generally equidistant from said first axis;
    (b) a second cleaning assembly including a second conical cleaning surface opposed to said first conical cleaning surface, said second conical cleaning surface (10B, 60) extending around a second axis such that a line perpendicular to said second axis passes through a pair of separate points on said second conical cleaning surface which are each generally equidistant from said second axis, said first and second conical cleaning surfaces being canted with respect to one another and said first and second axes being canted with respect to one another such that a radial contact portion of said first conical cleaning surface is substantially parallel and opposed to a radial contact portion of said second conical cleaning surface;
    (c) support means for supporting the wafer such that the work surfaces (102, 103) are each intermediate and contact a different one of said parallel radial contact portions of said first and second conical cleaning surfaces; and,
    (d) motive power means for moving at least one of the surfaces in the group consisting of
        (i) said work surfaces of the wafer,
        (ii) said first conical cleaning surface, and
        (iii) said second conical cleaning surface, to cause relative movement between said work surface of said wafer and at least one of said first and second conical cleaning surfaces.

2. A method of cleaning opposed work surfaces of a wafer, comprising the steps of
    (a) providing cleaning apparatus including
        (i) a first cleaning assembly including a first conical cleaning surface extending around a first axis such that a line perpendicular to said first axis passes through a pair of separate points on said first conical cleaning surface which are each generally equidistant from said first axis,
        (ii) a second cleaning assembly including a second conical cleaning surface said second conical cleaning surface extending around a second axis such that a line perpendicular to said second axis passes through a pair of separate points on said second conical cleaning surface which are each generally equidistant from said second axis, said first and second conical cleaning surfaces being canted with respect to one another and said first and second axes being canted with respect to one another such that a radial contact portion of said first conical cleaning surface is substantially parallel and opposed to a radial contact portion of said second conical cleaning surface;
    (b) positioning the wafer intermediate said first and second conical cleaning surfaces such that each of said work surfaces contacts a different one of said radial contact portions of said first and second conical cleaning surfaces; and,
    (c) moving at least one of the surfaces in the group consisting of
        (i) said work surfaces of the wafer,
        (ii) said first conical surface, and
        (iii) said second conical cleaning surface, to cause relative movement between said wafer and at least one of said first and second conical cleaning surfaces to clean said work surfaces of the wafer.

3. The apparatus of claim 1 wherein at least a portion of said support means is positioned intermediate said first and second conical cleaning surfaces.

4. The apparatus of claim 1 wherein said support means free wheels.

5. The apparatus of claim 1 wherein said support means is driven.

6. The apparatus of claim 1 wherein said support means includes disk means for contacting and supporting the wafer.

7. The apparatus of claim 6 wherein
    (a) the wafer includes a peripheral edge; and,
    (b) said disk means includes a groove in which said peripheral edge is seated.

8. The apparatus of claim 1 wherein
    (a) said first and second conical cleaning surfaces each have a center and a peripheral edge; and,
    (b) the wafer is shaped and dimensioned and positioned to
        (i) lie substantially entirely intermediate said center and said peripheral edge of at least one of said first and second conical cleaning surfaces; and,
        (ii) be centered on a single radial line extending from said center to said peripheral edge of at least one of said conical cleaning surfaces.

9. The apparatus of claim 1 wherein said canting of said first and second conical cleaning surfaces also, in addition to moving said radial contact portion of said first conical cleaning surface into substantially parallel relationship with said radial contact portion of said second conical cleaning surface, cants a portion of said first conical cleaning surface away from said second conical cleaning surface to facilitate the cleaning of said first and second conical cleaning surfaces.

10. The method of claim 2 wherein said canting of said first and second conical cleaning surfaces also, in addition to moving said radial contact portion of said first conical cleaning surface into substantially parallel relationship with said radial contact portion of said second conical cleaning surface, cants a portion of said first conical cleaning surface away from said second conical cleaning surface to facilitate the cleaning of said first and second conical cleaning surfaces.

11. The apparatus of claim 3 wherein movement by said motive power means of at least one in said group consisting of
    (i) said work surfaces of the wafer,
    (ii) said first conical cleaning surface, and
    (iii) said second conical cleaning surface, causes said wafer to rotate between said first and second conical cleaning surfaces.

12. The apparatus of claim 4 wherein movement by said motive power means of at least one in said group consisting of
    (i) said work surfaces of the wafer,
    (ii) said first conical cleaning surface, and
    (iii) said second conical cleaning surface, causes said wafer to mute between said first and second conical cleaning surfaces.

13. The apparatus of claim 5 wherein movement by said motive power means of at least one in said group consisting of (i) said work surfaces of the wafer, (ii) said first conical cleaning surface, and (iii) said second conical cleaning surface, causes said wafer to rotate between said first and second conical cleaning surfaces.

14. The apparatus of claim 6 wherein movement by said motive power means of at least one in said group consisting of (i) said work surfaces of the wafer, (ii) said first conical cleaning surface, and (iii) said second conical cleaning surface, causes said wafer to rotate between said first and second conical cleaning surfaces.

15. The apparatus of claim 7 wherein movement by said motive power means of at least one in said group consisting of (i) said work surfaces of the wafer, (ii) said first conical cleaning surface, and (iii) said second conical cleaning surface, causes said wafer to rotate between said first and second conical cleaning surfaces.

16. The apparatus of claim 8 wherein movement by said motive power means of at least one in said group consisting of (i) said work surfaces of the wafer, (ii) said first conical cleaning surface, and (iii) said second conical cleaning surface, causes said wafer to rotate between said first and second conical cleaning surfaces.

17. The apparatus of claim 9 wherein movement by said motive power means of at least one in said group consisting of (i) said work surfaces of the wafer, (ii) said first conical cleaning surface, and (iii) said second conical cleaning surface, causes said wafer to rotate between said first and second conical cleaning surfaces.

18. The method of claim 10 wherein movement by said motive power means of at least one in said group consisting of (i) said work surfaces of the wafer, (ii) said first conical cleaning surface, and (iii) said second conical cleaning surface, causes said wafer to rotate between said first and second conical cleaning surfaces.

19. Apparatus for cleaning a work surface of a wafer, comprising (a) a cleaning assembly including a conical cleaning surface extending around an axis such that a line perpendicular to said axis passes through a pair of separate points on said conical cleaning surface which are each generally equidistant from said axis, said conical cleaning surface and said axis each being canted with respect said work surface such that a radial contact portion of said conical cleaning surface is substantially parallel to said work surface;

(b) support means for supporting the wafer such that said work surface is adjacent and contacts said radial portion of said conical cleaning surface;

(c) motive power means for moving at least one of the surfaces in the group consisting of (i) said work surface of the wafer, and (ii) said conical cleaning surface, to cause said wafer to rotate.

* * * * *